(12) United States Patent
Shimizu et al.

(10) Patent No.: US 7,692,153 B2
(45) Date of Patent: Apr. 6, 2010

(54) SCINTILLATOR CRYSTAL AND RADIATION DETECTOR

(75) Inventors: Shigenori Shimizu, Tsukuba (JP); Senguttuvan Nachimuthu, Tsukuba (JP); Masahiro Aoshima, Tsukuba (JP); Keiji Sumiya, Tsukuba (JP); Hiroyuki Ishibashi, Hitachinaka (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 11/858,487

(22) Filed: Sep. 20, 2007

(65) Prior Publication Data

US 2008/0067391 A1 Mar. 20, 2008

(30) Foreign Application Priority Data

Sep. 20, 2006  (JP)  ............................. 2006-254408
Nov. 24, 2006  (JP)  ............................. 2006-317542

(51) Int. Cl.
*G01T 1/202* (2006.01)

(52) U.S. Cl. ................................................. 250/361 R
(58) Field of Classification Search .............. 250/361 R
See application file for complete search history.

(56) References Cited

U.S. PATENT DOCUMENTS

2008/0011953 A1 * 1/2008 Srivastava et al. ....... 250/361 R

FOREIGN PATENT DOCUMENTS

| JP | 62-008472 | B2 | 2/1987 |
| JP | 07-078215 | A | 3/1995 |
| JP | 02852944 | B2 | 11/1998 |
| JP | 2003-523446 | A | 8/2003 |
| JP | 2003-300795 | A | 10/2003 |
| JP | 2004-500462 | A | 1/2004 |
| JP | 2005-120378 | A | 5/2005 |
| JP | 2006-508227 | A | 3/2006 |
| JP | 2006-241458 | A | 9/2006 |
| WO | WO 2004/044613 | A2 | 5/2004 |

OTHER PUBLICATIONS

Shah et al., "CeBr$_3$ Scintillators for Gamma-Ray Spectroscopy", IEEE Transactions on Nuclear Science, vol. 52, No. 6, pp. 3157-3159, Dec. 2005.
J. Glodo et al., "Scintillation properties of LuI$_3$:Ce", Nuclear Instruments and Methods in Physics Research A 537 (2005) 279-281.
P. Dorenbos, "Light output and energy resolution of Ce$^{3+}$-doped scintillators" Nuclear Instruments and Methods in Physics Research A 486 (2002) 208-213.
E.V.D. Van Loef et al. Scintillation properties of LaBr$_3$:Ce$^{3+}$ crystals: fast, efficient and high-energy-resolution scintillators, Instruments and Methods in Physics Research A 486 (2002) 254-258.

* cited by examiner

*Primary Examiner*—David P Porta
*Assistant Examiner*—Marcus H Taningco
(74) *Attorney, Agent, or Firm*—Westerman, Hattori, Daniels & Adrian, LLP

(57) ABSTRACT

A scintillator crystal represented by the following general formula (1).

$$Ln_{(1-y)}Ce_yX_3:M \quad (1)$$

wherein $Ln_{(1-y)}Ce_yX_3$ represents the chemical composition of the matrix material, Ln represents one or more elements selected from the group consisting of rare earth elements, X represents one or more elements selected from the group consisting of halogen elements, M is the constituent element of the dopant which is doped in the matrix material and represents one or more elements selected from the group consisting of Li, Na, K, Rb, Cs, Al, Zn, Ga, Be, Mg, Ca, Sr, Ba, Sc, Ge, Ti, V, Cu, Nb, Cr, Mn, Fe, Co, Ni, Mo, Ru, Rh, Pb, Ag, Cd, In, Sn, Sb, Ta, W, Re, Os, Ir, Pt, Au, Hg, Tl and Bi, and y represents a numerical value satisfying the condition represented by the following inequality (A):

$$0.0001 \leq y \leq 1 \quad (A).$$

17 Claims, 2 Drawing Sheets

SCINTILLATOR CRYSTAL AND RADIATION DETECTOR

BACKGROUND OF THE INVENTION

1. Field of the Invention

The present invention relates to a scintillator crystal and to a radiation detector.

2. Related Background Art

Conventional radiation detectors that comprise scintillators are known as "scintillator-type radiation detectors". In such radiation detectors, radiation such as γ-rays first interact on the scintillator and generate fluorescence. The generated fluorescence is then detected by a photodetector such as a photomultiplier tube and converted to an electrical signal. The electrical signal is processed by various electronic circuits to obtain information such as the counting rate, fluorescent light quantity and time data. The obtained information is used to determine the intensity, energy and emitting position and direction of the incident radiation. Such scintillator-type radiation detectors are used in a wide variety of fields including, primarily, nuclear medicine, high energy physics, radiation control and underground stratigraphic inspection.

Scintillator-type radiation detectors generally have inferior energy discretion compared to semiconductor detectors, another known means for γ-ray detection. However, some scintillator-type radiation detectors have higher densities and effective atomic numbers than semiconductor detectors, and their response times for single rays are also shorter. It may therefore be concluded that scintillator-type radiation detectors are more suitable than semiconductor detectors for detection of high energy γ-rays, or when highly precise time data or high detection efficiency are required.

Some of the characteristics required for scintillator-type radiation detectors for γ-ray detection include high γ-ray detection efficiency, excellent energy discretion and superior time resolution. Among the characteristics required for scintillators that exhibit all of these, there may be mentioned high density and effective atomic number, large fluorescent light quantity (fluorescence intensity), a fluorescent wavelength suitable for the wavelength sensitivity of the photodetector, excellent energy resolution and a rapid fluorescence rise and short decay time.

A higher density and effective atomic number of the scintillator increases the probability of interaction between the γ-rays and scintillator and can thus increase the detection efficiency. A short fluorescent decay time results in a shorter processing time for each γ-ray thus allowing signal processing for more γ-rays in a shorter time, for a higher "time sensitivity". On the other hand, in order to increase the energy discretion of the scintillator-type radiation detector it is necessary to minimize quantum conversion in the corresponding photodetector and fluctuation during amplification in the circuit that processes the obtained electrical signal. This can only be realized with a large fluorescent light quantity (fluorescence intensity) at the fluorescent wavelength suited for the sensitivity wavelength of the photodetector.

Moreover, as mentioned above, superior energy resolution of the scintillator itself is also important. When two γ-rays interact essentially simultaneously on the scintillator, fluorescence emissions are produced from the scintillator for each γ-ray. The time resolution of the scintillator-type radiation detector may be evaluated, for example, based on distribution when statistically measuring the time variance in the electrical signal obtained from these fluorescence emissions. Superior time resolution can only be achieved by enlarging the electrical signal at the small time Δt from the instant fluorescence is produced. The conditions for the scintillator to enlarge the electrical signal include a large fluorescent light quantity, a fluorescent wavelength suited for the photodetector, a rapid rise of fluorescence and a short decay time.

A Positron Emission Tomography (PET) device in a nuclear medicine diagnostic apparatus, typical of those widely used in recent years, will now be explained as an example of application of a scintillator-type radiation detector. A PET apparatus is a device that images the distribution of a drug composed mainly of a sugar, for example and containing a positron-emitting nuclide-containing species, that has been administered to the body of a subject. This type of PET apparatus can be used to detect even initial-stage cancerous masses with millimeter unit sizes.

The positrons emitted from the drug immediately bond with neighboring electrons to cause pair annihilation, whereupon a pair of annihilation γ-rays are emitted in directions 180° to each other. The γ-rays are captured simultaneously by a plurality of scintillator-type radiation detectors arranged in ring. Since the drug lies on a straight line connecting the two scintillators onto which the γ-rays are interacting, it is possible to acquire a drug distribution in the body by reconstructing an image from information based on the γ-rays.

Since the resolution of the image is of utmost importance in a PET apparatus, the size of each scintillator element must be reduced. It is preferred for diagnosis with a PET apparatus to be completed within a short period of time. In order to achieve this, it is desirable for the PET apparatus to have improved detection efficiency for annihilation γ-rays with a high energy dose of 511 keV.

In order to distinguish between scattering of annihilation γ-rays that occurs in the body and external γ-rays, it is important for the scintillator-type radiation detector to have high energy discretion. In addition, since a very brief time window exists for coincidence of the pair of annihilation γ-rays, it is preferred for the scintillator-type radiation detector to have excellent time resolution.

Scintillators are largely classified as either organic scintillators or inorganic scintillators, based on their structural materials. As inorganic scintillators there may be mentioned those employing materials such as NaI:Tl, CsI:Tl, $Bi_4Ge_3O_{12}$ (BGO), $Gd_2SiO_5$:Ce (GSO) (for example, see Japanese Patent Application Laid-Open SHO No. 62-008472 and Japanese Patent Application Laid-Open No. 2003-300795), $Lu_2SiO_5$:Ce (LSO) (for example, see Japanese Patent Publication No. 2852944) and the like.

Most known among these are inorganic scintillators employing NaI:Tl as the material. Such inorganic scintillators have become the most commonly and almost exclusively used type of scintillators in the field of γ-ray detectors, since their discovery by R. Hofstadter in 1948 until the present time. Because NaI is hygroscopic it must be subjected to waterproof treatment with packaging, for example, when it is used. Such inorganic scintillators, however, have excellent cost performance and are appropriate for large crystal sizes, while their fluorescent light quantities are large and their fluorescent wavelengths are suitable for reading by photomultiplier tubes. The drawbacks of inorganic scintillators include rather low density, slow fluorescence rise and long fluorescent decay time.

Other inorganic scintillators, such as those employing CsI:Tl, have weaker deliquescence and large fluorescent light quantity compared to those employing NaI:Tl. On the other hand, the fluorescence rise time and decay time is longer than NaI:Tl, while the density is not very high. Scintillators employing BGO have very large densities and effective atomic numbers, as well as very strong deliquescence. However, such scintillators have drawbacks including low fluorescent light quantity, fluorescent wavelengths that are not suited for photomultiplier tubes, and long decay times.

Scintillators employing GSO:Ce were the first to utilize the high luminous efficiency and rapid decay of Ce. Such scintillators have rapid decay times and excellent energy resolution. However, their fluorescent light quantity is not very large and the fluorescence rise times are slow. LSO:Ce scintillators have short fluorescence rise times and decay times, with large fluorescent light quantity and fluorescent wavelengths suitable for photomultiplier tubes. These scintillators, however, are limited in their uses because of their unsatisfactory energy resolution and their very high autofluorescence due to radioactive isotopes in Lu.

For this reason, rare earth halide single crystals and rare earth alkali halide single crystals, comprising Ce as the activator are becoming a focus of interest as new scintillator materials. Previously disclosed rare earth alkali halides for use in scintillators include $RbGd_2Br_7$:Ce (for example, Nuclear Instrument And Methods In Physics Research A486 (2002) p. 208, and Japanese Patent Application Laid-Open No. 2006-508227), $K_2LaCl_5$ (for example, Nuclear Instrument And Methods In Physics Research A486 (2002) p. 208). Previously disclosed rare earth halides for use in scintillators include $LaCl_3$ (for example, Japanese Patent Application Laid-Open No. 2004-500462), $LaBr_3$ (for example, Japanese Patent Application Laid-Open No. 2003-523446 and Nuclear Instruments and Methods In Physics Research A486 (2002) p. 254), $CeBr_3$ (for example, IEEE Transactions Nuclear Science, Vol. 52 (2005) p. 3157), $LuI_3$:Ce (for example, Nuclear Instrument And Methods In Physics Research A537 (2005) p. 279), $LaCl_3xBr_{3(1-x)}$:Ce (for example, Japanese Patent Application Laid-Open No. 2005-120378) and $CeCl_{3x}Br_{3(1-x)}$ (for example, Japanese Patent Application Laid-Open No. 2006-241458). In particular, scintillators employing such rare earth halide single crystals offer the advantage of large fluorescent light quantity, excellent energy resolution and short fluorescent decay time.

Among these, $LaBr_3$:Ce and $CeBr_3$ have superior density, effective atomic number, fluorescent light quantity, energy resolution, fluorescence rise and fluorescent decay time for the scintillator employing the material, compared to NaI:Tl. These materials are therefore expected to become widely used in fields of scintillator-type radiation detector applications. In particular, the materials are noted for their high energy resolution and high time resolution for radiation detectors incorporating the scintillators. Scintillators employing such materials, therefore, are considered very promising for TOF-PET applications that incorporate TOF (Time of Flight) systems, which are candidates for second generation PET in nuclear medicine (for example, see International Publication Number WO 04/044613 pamphlet).

The major characteristics of inorganic scintillators employing conventional materials as explained above are listed in Table 1.

TABLE 1

| Material | Density (g/cm³) | Fluorescent light quantity (photon/MeV) | Fluorescent peak wavelength (nm) | Fluorescent decay time (ns) |
|---|---|---|---|---|
| NaI:Tl | 3.67 | 38000 | 415 | 230 |
| CsI:Tl | 4.53 | 52000 | 540 | 1000 |
| $Bi_4Ge_3O_{12}$ | 7.13 | 8000 | 480 | 300 |
| $Gd_2SiO_5$:Ce | 6.71 | 10000 | 440 | 30-60 |
| $Lu_2SiO_5$:Ce | 7.4 | 26000 | 420 | 42 |
| $LaBr_3$:Ce | 5.29 | 61000 | 360, 380 | 15-25 |
| $CeBr_3$ | 5.2 | 68000 | 370, 390 | 17 |

SUMMARY OF THE INVENTION

Scintillators employing $LaBr_3$:Ce or $CeBr_3$, however, have shorter fluorescent wavelength peaks than the sensitivity wavelength peaks of the bialkali photomultiplier tubes that are the most commonly used type of photomultiplier tubes. The signals actually obtained from such scintillators through their photomultiplier tubes, therefore, are small for the magnitude of their fluorescent light quantity. For example, the fluorescent wavelength peaks for $LaBr_3$:Ce are at 360 nm and 380 nm, as shown in Table 1 above. Of these two fluorescent wavelength peaks, the fluorescent wavelength peak near 360 nm has the greater fluorescent light quantity. In contrast, a bialkali photomultiplier tube commonly used in a scintillator-type radiation detector has a sensitivity wavelength peak at 400 nm, and the fluorescent wavelength peak of the scintillator is significantly shorter than the sensitivity wavelength peak of the photomultiplier tube. As a result, the signal actually obtained through the photomultiplier tube is small for the magnitude of the fluorescent light quantity of the scintillator, rendering the scintillator unsuitable for a photomultiplier tube.

Methods of shifting the fluorescent wavelength of the scintillator have been considered in order to render such scintillators suitable for photomultiplier tubes. One such method is disclosed in Japanese Patent Application Laid-Open HEI No. 07-078215, for example. According to this publication, the Gd site of $Gd_2SiO_5$:Ce is replaced with Lu, also a rare earth element, at about 10 mol % to alter the crystal field surrounding $Ce^{3+}$. This can shift the fluorescent wavelength toward the short wavelength end.

However, the method requires replacement between two elements with different ion radii, and therefore crystallization is prevented and cracks tend to be produced during crystal formation. Also, when the replacing element has a lower atomic number than the replaced element, the density or effective atomic number of the obtained crystal is smaller than that of the original crystal.

The present invention has been accomplished in light of these circumstances, and its object is to provide a scintillator crystal that when used as a scintillator, is satisfactorily suited for a photomultiplier tube without reduction in the crystal density or effective atomic number, as well as a radiation detector employing the scintillator crystal.

The present inventors have conducted assiduous research on the physical mechanism by which fluorescence is generated by $LaBr_3$:Ce or $CeBr_3$. As a result we have found that in order to increase the long wavelength component that is compatible with the sensitivity wavelength of a photomultiplier tube, of the two fluorescent wavelength peaks present in both, it is effective to add a trace amount of, i.e. dope with, a substance including an element selected from the group of monovalent-trivalent metal elements, and the invention has been completed upon this finding.

Specifically, the invention provides a scintillator crystal represented by the following general formula (1).

$$Ln_{(1-y)}Ce_yX_3:M \qquad (1)$$

In general formula (1), $Ln_{(1-y)}Ce_yX_3$ represents the chemical composition of the matrix material, Ln represents one or more elements selected from the group consisting of rare earth elements, X represents one or more elements selected from the group consisting of halogen elements, M is the constituent element of the dopant which is doped in the matrix material and represents one or more elements selected from the group consisting of Li, Na, K, Rb, Cs, Al, Zn, Ga, Be, Mg, Ca, Sr, Ba, Sc, Ge, Ti, V, Cu, Nb, Cr, Mn, Fe, Co, Ni, Mo, Ru, Rh, Pb, Ag, Cd, In, Sn, Sb, Ta, W, Re, Os, Ir, Pt, Au, Hg, Ti and Bi, and y represents a numerical value satisfying the condition represented by the following inequality (A):

$$0.0001 \leq y \leq 1 \qquad (A).$$

With the scintillator crystal of the invention, impinging γ-rays can efficiently generate fluorescence at the long wavelength end that is compatible with the wavelength sensitivity peak of a photomultiplier tube.

The present inventors think the following reason for this effect. When $LaBr_3$:Ce or $CeBr_3$ is used as the matrix material of the scintillator crystal, for example, γ-rays impinging on the crystal cause rebonding between electrons and positive holes, so that energy migrates to $Ce^{3+}$. As a result, the $Ce^{3+}$ excitation from the spin-orbit-split 4f ground states ($4F_{2/7}$ and $4F_{2/5}$) to the excited 5d states. The electrons therefore transition to the two different states of the 4f in a fixed proportion. Two fluorescent wavelength peaks are therefore observed. In the case of $LaBr_3$:Ce, for example, transition to the $4F_{2/5}$ state generates fluorescence at 360 nm, while transition to the $4F_{2/7}$ state generates fluorescence at 380 nm.

The metal element that is the constituent element of the dopant affects the electronic state of $Ce^{3+}$ when in the vicinity of $Ce^{3+}$. This reduces the transition from the 5d to the $4F_{2/5}$ state, that generates the short wavelength component which is not compatible with the sensitivity wavelength peak of the photomultiplier tube. At the same time it can increase the transition from the 5d to the $4F_{2/7}$ state, that generates the long wavelength component which is compatible with the sensitivity wavelength peak of the photomultiplier tube. As a result it is possible to increase emission of long wavelength components that are compatible with the sensitivity wavelength of the photomultiplier tube.

The Ln element in the scintillator crystal of the invention is preferably La.

By using La it is possible to obtain a crystal with higher clarity, and to obtain a scintillator with more efficient fluorescent emission by the fluorescent activator (Ce).

The X element in the scintillator crystal of the invention is preferably Br.

Using Br can yield a scintillator with more efficient fluorescent emission.

The M in the scintillator crystal is preferably present at 0.0001-0.05% by weight with respect to the total weight of the scintillator crystal. An M content within this range can further prevent adverse effects on other properties. The long wavelength component of the fluorescence can also be increased to obtain a fluorescent wavelength more adequately suited for a photomultiplier tube.

When using a scintillator crystal according to the invention, the fluorescence intensity distribution for the wavelength of emitted fluorescence has two maximum values, and of these maximum values, the value of the fluorescence intensity for the maximum value at the short wavelength end divided by the fluorescence intensity for the maximum value at the long wavelength end is preferably greater than 0.7.

By using a scintillator crystal exhibiting such fluorescence intensity, it is possible to obtain sufficient fluorescence at a wavelength suitable for the wavelength sensitivity of a photomultiplier tube.

The scintillator crystal of the invention is preferably a single crystal. By using a single crystal it is possible to obtain a scintillator with high transparency.

By forming a scintillator comprising a scintillator crystal of the invention is formed on the outer photoelectric surface of the photomultiplier tube, it is possible to provide a radiation detector and a positron emission tomography apparatus that can exhibit the performance demanded in the fields of nuclear medicine, high energy physics, radiation control and underground stratigraphic inspection.

According to the invention, it is possible to obtain a scintillator crystal that, when used as a scintillator, is satisfactorily resistant to cracking and is adequately suitable for a photomultiplier tube without reducing the crystal density or effective atomic number, as well as a radiation detector employing the scintillator crystal.

DESCRIPTION OF THE PREFERRED EMBODIMENTS

Figure 1:
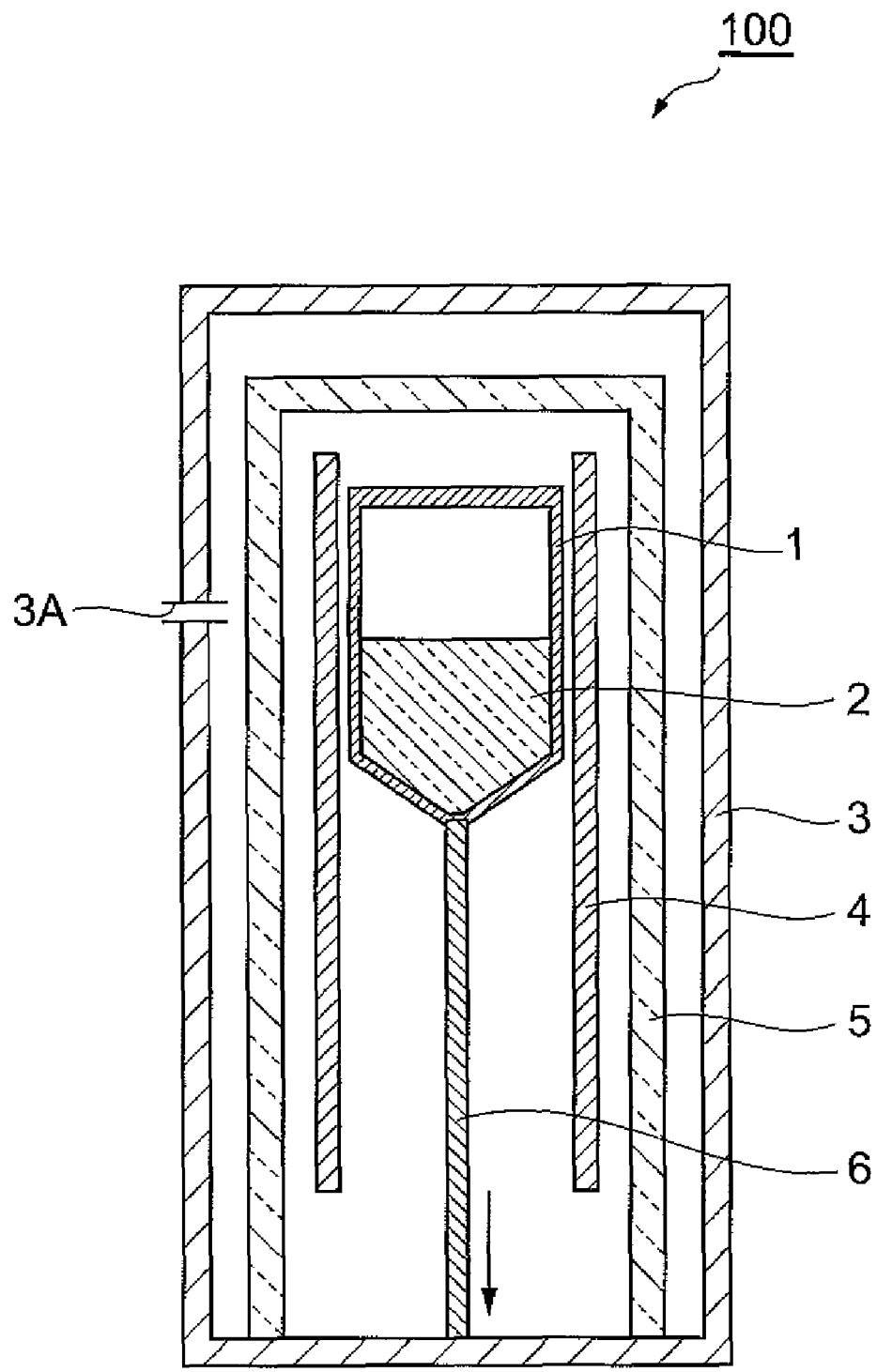
FIG. 1 is a schematic cross-sectional view showing the structure of a furnace (VB furnace) used in the Bridgman method.

Preferred embodiments of the invention will now be explained in detail, with reference to the accompanying drawings as necessary. Throughout the drawings, corresponding elements will be referred to by the same reference numerals and will be explained only once. Unless otherwise specified, the vertical and horizontal positional relationships are based on the positional relationships in the drawings. The dimensional proportions in the drawings are not restricted to the proportions shown.

The scintillator crystal of this embodiment is represented by the following general formula (1).

$$Ln_{(1-y)}Ce_yX_3:M \qquad (1)$$

In general formula (1), $Ln_{(1-y)}Ce_yX_3$ represents the chemical composition of the matrix material, Ln represents one or more elements selected from the group consisting of rare earth elements, X represents one or more elements selected from the group consisting of halogen elements, M is the constituent element of the dopant which is doped in the matrix material and represents one or more elements selected from the group consisting of Li, Na, K, Rb, Cs, Al, Zn, Ga, Be, Mg, Ca, Sr, Ba, Sc, Ge, Ti, V, Cu, Nb, Cr, Mn, Fe, Co, Ni, Mo, Ru, Rh, Pb, Ag, Cd, In, Sn, Sb, Ta, W, Re, Os, Ir, Pt, Au, Hg, Tl and Bi, and y represents a numerical value satisfying the condition represented by the following inequality (A):

$$0.0001 \leq y \leq 1 \qquad (A).$$

The scintillator crystal is preferably one with high transparency and which grows a single crystal relatively easily, with efficient emission by the fluorescent activator. Therefore, La is most preferred among the rare earth elements Ln.

The fluorescent activator Ce can be present in the scintillator crystal in a wide concentration range. For example, when y in inequality (A) is 1, it will be a rare earth halide scintillator crystal represented by the general formula $CeX_3$:M. In this case, the scintillator crystal does not need to contain another fluorescent activator.

If the concentration of Ce in the scintillator crystal is too low, i.e. if the value of y in general formula (1) is less than 0.0001, the fluorescent light quantity will tend to be reduced. The concentration of Ce is preferably such that the value of y in general formula (1) is 0.001-0.1, and more preferably 0.005-0.05.

X in general formula (1) is one or more elements selected from the group consisting of halogen elements, and specifically F, Cl, Br, I or the like may be used alone or in combinations of two or more. The scintillator crystal is preferably one with high transparency and which grows a single crystal relatively easily, also with efficient emission by the fluorescent activator. Br is most preferably used for this purpose.

M in general formula (1) is the constituent element of the dopant and represents one or more selected from the group consisting of Li, Na, K, Rb, Cs, Al, Zn, Ga, Be, Mg, Ca, Sr, Ba, Sc, Ge, Ti, V, Cu, Nb, Cr, Mn, Fe, Co, Ni, Mo, Ru, Rh, Pb, Ag, Cd, In, Sn, Sb, Ta, W, Re, Os, Ir, Pt, Au, Hg, Tl and Bi, which are metal elements of valency 1-3.

M is preferably an element having a bromide starting material, and having a valency and ion radius allowing it to be easily incorporated into the scintillator crystal. As elements satisfying these conditions there are preferred Ga, Ca, Sr, Sc, Ti, Na, Fe, Mn, Co, Ni, In, Sb and Bi, among which Na, Fe and Ni are especially preferred. The elements may be used alone, or two or more may be used in combinations.

The proportion of M in the scintillator crystal represented by general formula (1) is preferably 0.0001-0.05% by weight, more preferably 0.0001-0.01% by weight and even more preferably 0.0005-0.01% by weight based on the total weight of the scintillator crystal. If the proportion is less than 0.0001% by weight, it will tend to be difficult to achieve the effect of the invention. If the proportion exceeds 0.05% by weight, more cracks will tend to be produced in the scintillator crystal.

The scintillator crystal of this embodiment exhibits two maximum values in the fluorescence intensity distribution for the wavelength of emitted fluorescence, and of these maximum values, the fluorescence intensity for the maximum value at the short wavelength end divided by the fluorescence intensity for the maximum value at the long wavelength end (fluorescence intensity ratio) is preferably greater than 0.7, and more preferably 0.8 or greater. A fluorescence intensity ratio of 0.7 or smaller may not allow improvement in the light output described hereunder. On the other hand, a fluorescence intensity ratio of 0.8 or greater can result in even greater fluorescence at a wavelength compatible with the sensitivity wavelength peak of the photomultiplier tube.

The fluorescence intensity distribution can be obtained by adding a dopant, in an amount that will not produce cracking in the scintillator crystal, in order to affect the electronic state of the $Ce^{3+}$ and alter the electron transition.

The scintillator crystal of this embodiment is preferably a single crystal from the standpoint of obtaining a scintillator with high transparency.

The method of producing the scintillator single crystal may be, for example, the Bridgman method or Czochralski method whereby a mixture of a halogenated compound and dopant is heated to melting and then cooled for crystallization.

A process for production of a scintillator single crystal according to an embodiment of the invention by the Bridgman method will now be explained.

FIG. 1 is a schematic cross-sectional view showing the structure of a furnace (VB furnace) used in the Bridgman method. The VB furnace 100 shown in FIG. 1 is composed of a crucible 1 that holds the starting material 2 and is vertically movable, a heater 4 for forming a temperature gradient along the lowering direction (arrow in the drawing) of the crucible 1, a shaft 6 for moving the crucible 1 in the vertical direction, an insulating member 5 that surrounds the above, and a vessel 3 that can hermetically seal all of the above. An exhaust vent 3A is provided on the side of the vessel 3.

The starting substance for the matrix material of the scintillator single crystal may be a commercially available compound such as $LaBr_3$ or $CeBr_3$. These substances are preferably in a thoroughly dry state. They are also preferably of as high a purity as possible, with 99.9% by weight or greater and even more preferably 99.99% by weight or greater purity.

The dopant added in a trace amount to dope the matrix material may be a substance containing an element such as Na, Fe, Cr or Ni. Preferred examples of such substances include $NaBr$, $FeBr_2$, $CrBr_2$ and $NiBr_2$. The substance used as the dopant is also preferably of as high a purity as possible, with 99% by weight or greater and even more preferably 99.9% by weight or greater purity.

The crucible 1 used may be made of a material such as quartz glass, carbon, platinum or the like, which does not melt even at high temperatures of about 1000° C. The mixture 2 comprising the matrix starting material and the dopant is loaded into the crucible.

When the crucible 1 used is a quartz glass tube, for example, the interior of the tube in which the mixture 2 is loaded is preferably sealed in a reduced pressure state of 1 Pa or lower to prepare an ampule. On the other hand, when a carbon or platinum crucible is used, the VB furnace 100 is preferably in a reduced pressure state of $10^{-2}$ Pa or lower, or is filled with an inert gas such as nitrogen. The VB furnace 100 may have a construction that allows evacuation from the exhaust vent 3A for sealing in a reduced pressure state.

Growth of the scintillator single crystal is accomplished by setting the crucible 1 loaded with the mixture 2 in the VB furnace 100, heating the mixture 2 to a temperature of about 800° C. for melting, and then gradually lowering the crucible 1 (in the direction of the arrow of FIG. 1) into a VB furnace with a temperature gradient of 3° C./cm-10° C./cm for cooling.

The lowering speed for the crucible 1 is preferably no greater than 3 mm/h, more preferably no greater than 1 mm/h and even more preferably no greater than 0.5 mm/h from the standpoint of avoiding cracks and easily obtaining a crystal with high clarity.

The scintillator crystal obtained in this manner functions as a scintillator to be set on the outside of the photoelectric surface of a photomultiplier tube. The radiation detector is provided with the scintillator and a photomultiplier tube. The radiation detector can be used by being incorporated into a positron emission tomography apparatus, in a manner similar to a known radiation detector. The photomultiplier tube may be any publicly known type. The members other than the scintillator in the radiation detector and positron emission tomography apparatus may also be publicly known types.

A method of evaluating the obtained rare earth halide scintillator will now be explained. The evaluating method may be, for example, measurement of the content of M in the general formula (1), i.e. the constituent element of the dopant, measurement of the fluorescence spectrum or measurement of the light output.

The content of M is represented as a weight percentage with respect to the total mass of the actually grown single crystal. The measuring method may be, for example, inductively coupled plasma-atomic emission spectroscopy (hereinafter referred to as ICP-AES) or an atomic absorption method. These different measuring methods will have different sensitivities depending on the elemental species. For example, Na in the dopant is preferably measured by atomic absorption, while Ni and Fe are preferably measured by ICP-AES.

The fluorescence spectrum is an intensity distribution for fluorescence at the wavelength of fluorescent emission obtained from a crystal excited with γ-rays, X-rays, ultraviolet rays or the like. In actuality, the important factor when using the scintillator will be the manner of fluorescence spectrum obtained upon excitation induced by radiation by γ-rays or the like.

The fluorescence spectrum generated by excitation with X-rays or ultraviolet rays may be used for evaluation of the fluorescence spectrum of the scintillator crystal. Measurement of the fluorescence spectrum produced by excitation with ultraviolet rays is convenient and widely used, and yields a fluorescence spectrum roughly similar to that obtained by X-ray excitation. It can therefore be used for evaluation of the scintillator crystal. The fluorescence spectrum produced by ultraviolet ray excitation can be measured using a fluorophotometer or the like.

The light output is represented as follows. For example, the scintillator is combined with a photomultiplier tube that has a fast response speed suitable for radiation counting. The scintillator is then irradiated with γ-rays of a single energy, such as γ-rays of about 662 KeV obtained from $^{137}$Cs. The light output is represented as the average value of the fluorescent light quantity obtained upon absorption of the total energy of the γ-rays in the scintillator.

The above explanation of a preferred embodiment of the invention is not intended to restrict the scope of the invention to this particular mode.

EXAMPLES

The present invention will now be explained in greater detail based on examples and comparative examples, with the understanding that these examples are in no way limitative on the invention.

Example 1

The starting matrix material for the scintillator crystal comprised 25 g of LaBr$_3$ (99.99% purity, product of Aldrich Co.) and 0.125 g of CeBr$_3$ (99.99% purity, product of Aldrich Co.). The dopant starting material for the scintillator crystal comprised 2.5125 mg of NaBr (99.99% purity, product of Aldrich Co.), 2.5125 mg of FeBr$_2$ (99.99% purity, product of Aldrich Co.) and 2.5125 mg of NiBr$_2$ (99.99% purity, product of Aldrich Co.). The matrix starting material and dopant starting material were combined to obtain a mixture.

The obtained mixture was loaded into a quartz ampule, and the interior of the quartz ampule was reduced in pressure to 1 Pa and hermetically sealed in that state. The quartz ampule was then set in a prescribed location of a VB furnace.

This was followed by single crystal growth by the Bridgman method in the manner described below. First, the heater was heated to 800° C. and the quartz ampule was held for 24 hours in that state to melt the mixture. The quartz ampule was then lowered for 200 hours at a speed of 0.5 mm/h. After the lowering was completed, the heater power was switched off. The quartz ampule was kept in that position, i.e. the 200 hour-lowering position, until cooling to room temperature, to obtain a single crystal.

Example 2

A single crystal was produced in the same manner as Example 1, except that 5.025 mg of NaBr (99.99% purity, product of Aldrich Co.) was used as the dopant starting material for the scintillator crystal.

Example 3

A single crystal was produced in the same manner as Example 1, except that 5.025 mg of FeBr$_2$ (99.999% purity, product of Aldrich Co.) was used as the dopant starting material for the scintillator crystal.

Example 4

A single crystal was produced in the same manner as Example 1, except that 25 g of CeBr$_3$ (99.99% purity, product of Aldrich Co.) was used as the matrix starting material for the scintillator crystal, and 2.5 mg of NaBr (99.99% purity, product of Aldrich Co.), 2.5 mg of FeBr$_2$ (99.999% purity, product of Aldrich Co.) and 2.5 mg of NiBr$_2$ (99.999% purity, product of Aldrich Co.) were used as dopant starting materials for the scintillator crystal.

Example 5

A single crystal was produced in the same manner as Example 4, except that 5.0 mg of NaBr (99.99% purity, product of Aldrich Co.) was used as the dopant starting material for the scintillator crystal.

Example 6

A single crystal was produced in the same manner as Example 4, except that 5.0 mg of FeBr$_2$ (99.999% purity, product of Aldrich Co.) was used as the dopant starting material for the scintillator crystal.

Comparative Example 1

A single crystal was produced in the same manner as Example 1, except that no scintillator crystal dopant starting material was added.

Comparative Example 2

A single crystal was produced in the same manner as Example 4, except that no scintillator crystal dopant starting material was added.

The outer appearances of the single crystals produced in the examples and comparative examples were visually evaluated. The evaluation scale used was: A for crystals that were colorless and transparent with virtually no cracks on the surface, B for crystals that were colorless and transparent with slight cracking on the edges of the single crystal, C for crystals that were colorless and transparent with numerous cracks, and D for colored crystals. Crystals evaluated as A or B were judged to be satisfactory.

The contents of each of the constituent elements of the dopants in the single crystals produced in the examples and comparative examples were measured. The Na content was measured using an atomic absorptiometer (trade name: Z-5010 by Hitachi, Ltd.), and the Fe and Ni contents were measured using an ICP-AES device (trade name: SPS3000 by SII NanoTechnology Inc.).

The fluorescence spectra of the single crystals produced in the examples and comparative examples were measured using a fluorophotometer (trade name: F4500 by Hitachi, Ltd.). The excitation light used was 240 nm ultraviolet rays.

The light outputs of the single crystals produced in the examples and comparative examples were measured using 662 KeV γ-rays obtained from $^{137}$Cs.

Figure 2:
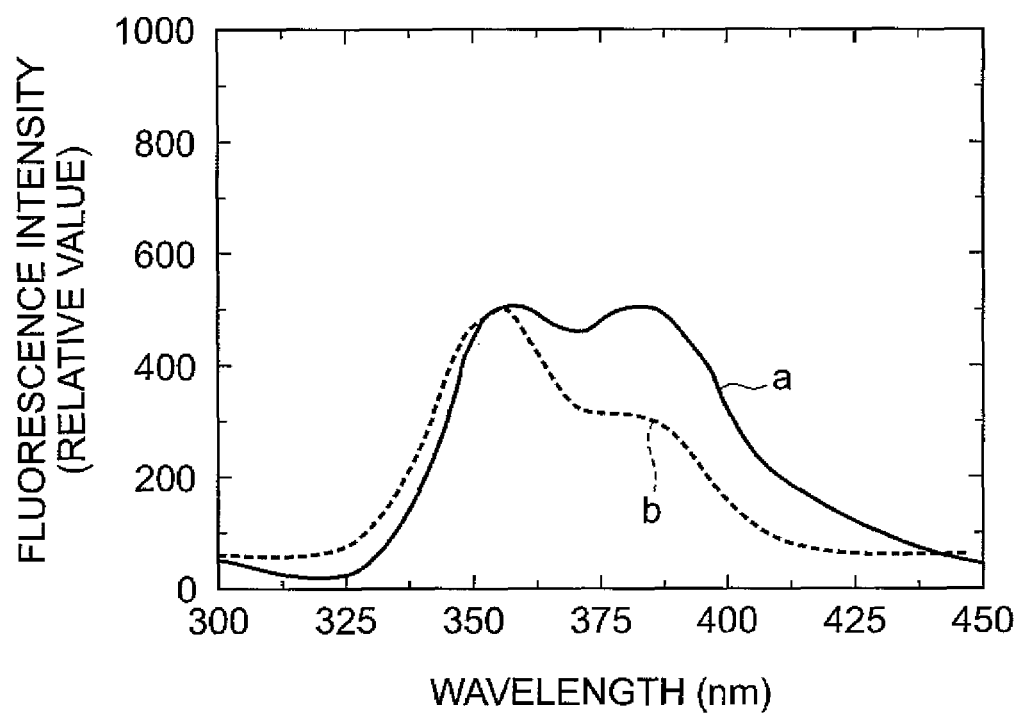
FIG. 2 is a diagram showing the fluorescence spectra for Example 1 and Comparative Example 1 due to excitation of ultraviolet rays at 240 nm.

The evaluation and measurement results are shown in FIG. 2 and Table 2.

FIG. 2 is a diagram showing the fluorescent spectra for Example 1 and Comparative Example 1 due to excitation of ultraviolet rays at 240 nm. Spectrum "a" in FIG. 2 is the fluorescence spectrum for the single crystal of Example 1, and spectrum "b" in FIG. 2 is the fluorescence spectrum for the single crystal of Comparative Example 1. It was confirmed that the single crystal of Example 1 had increased fluorescence of the long wavelength component, which is compatible with the sensitivity wavelength peak of a photomultiplier tube, compared to the single crystal of Comparative Example 1.

TABLE 2

| | Matrix material | Single crystal appearance | Additive content % by weight) | | | Fluorescent peak wavelength (nm) | Fluorescence intensity for peak wavelength (*1) | Light output (*2) |
|---|---|---|---|---|---|---|---|---|
| | | | Na | Fe | Ni | | | |
| Example 1 | $La_{0.995}Ce_{0.005}Br_3$ | A | 0.0005-0.0015 | 0.0005-0.0015 | 0.0005-0.0015 | 360, 380 | 1.0 | 1.2 |
| Example 2 | $La_{0.995}Ce_{0.005}Br_3$ | A | 0.001-0.003 | — | — | 360, 380 | 0.9 | 1.2 |
| Example 3 | $La_{0.995}Ce_{0.005}Br_3$ | B | — | 0.001-0.003 | — | 360, 380 | 0.8 | 1.1 |
| Example 4 | $CeBr_3$ | A | 0.0005-0.0015 | 0.0005-0.0015 | 0.0005-0.0015 | 355, 375 | 1.1 | 1.3 |
| Example 5 | $CeBr_3$ | B | 0.001-0.003 | — | — | 355, 375 | 1.0 | 1.3 |
| Example 6 | $CeBr_3$ | A | — | 0.001-0.003 | — | 355, 375 | 0.9 | 1.2 |
| Comp. Ex. 1 | $La_{0.995}Ce_{0.005}Br_3$ | A | — | — | — | 360, 380 | 0.6 | 1 |
| Comp. Ex. 2 | $CeBr_3$ | B | — | — | — | 355, 375 | 0.7 | 1.1 |

(*1): Value of fluorescence intensity for fluorescent peak wavelength at long wavelength end divided by fluorescence intensity for fluorescent peak wavelength at short wavelength end. A larger value indicates a larger relative value for the fluorescent component of the fluorescent peak wavelength at the long wavelength end.
(*2): Relative value with Comp. Ex. 1 defined as 1.

As shown in Table 2, with the single crystals of Examples 1, 2 and 3 which contained the added dopants it was possible to increase the fluorescence of the long wavelength component, which is compatible with the sensitivity wavelength peak of a photomultiplier tube, compared to the single crystal of Comparative Example 1 which employed the same matrix material but had no added dopant. The light output was also improved.

he single crystals obtained in Examples 4, 5 and 6 which contained added dopants, it was also possible to increase the fluorescence of the long wavelength component which is compatible with the sensitivity wavelength peak of a photo-multiplier tube, compared to the single crystal of Comparative Example 2 which employed the same matrix material but had no added dopant. The light output was also improved.

In general formula $Ln_{(1-y)}Ce_yX_3$ of the present invention, where $Ln_{(1-y)}Ce_yX_3$ represents the chemical composition of the matrix material, Ln represents one or more elements selected from the group consisting of rare earth elements, X represents one or more elements selected from the group consisting of halogen elements, M is the constituent element of the dopant which is doped in the matrix material and represents one or more elements selected from the group consisting of Li, Na, K, Rb, Cs, Al, Zn, Ga, Be, Mg, Ca, Sr, Ba, Sc, Ge, Ti, V, Cu, Nb, Cr, Mn, Fe, Co, Ni, Mo, Ru, Rh, Pb, Ag, Cd, In, Sn, Sb, Ta, W, Re, Os, Ir, Pt, Au, Hg, Tl and Bi, and y represents a numerical value satisfying the condition represented by the following inequality (A): $0.0001 \leq y \leq 1$ (A), there are typical combinations of Ln, X and M which reveal remarkable effect of the present invention as well as Examples 1 to 6. The typical combinations are indicated in Table 3, with Examples 1 to 6.

TABLE 3

| | Ln | X | M |
|---|---|---|---|
| Example 1 | La | Br | Na, Fe, Ni |
| Example 2 | La | Br | Na |
| Example 3 | La | Br | Fe |
| Example 4 | Ce | Br | Na, Fe, Ni |
| Example 5 | Ce | Br | Na |
| Example 6 | Ce | Br | Fe |
| Combination 1 | La | Br | One or more elements selected from Ca, Ga, Co |
| Combination 2 | Ce | Br | One or more elements selected from Ca, Ga, Co |
| Combination 3 | Ce | Br | One or more elements selected from Mn, Ti, Bi |
| Combination 4 | Lu | I | One or more elements selected from Na, Fe, Ni |
| Combination 5 | La | Cl | One or more elements selected from Na, Fe, Ni |
| Combination 6 | Ce | Cl | One or more elements selected from Na, Fe, Ni |
| Combination 7 | Lu | I | One or more elements selected from Ca, Ga, Co |
| Combination 8 | La | Cl | One or more elements selected from Ca, Ga, Co |
| Combination 9 | Ce | Cl | One or more elements selected from Ca, Ga, Co |
| Combination 10 | Lu | I | One or more elements selected from Mn, Ti, Bi |
| Combination 11 | La | Cl | One or more elements selected from Mn, Ti, Bi |
| Combination 12 | Ce | Cl | One or more elements selected from Mn, Ti, Bi |
| Combination 13 | La | Cl, Br | One or more elements selected from Na, Fe, Ni |
| Combination 14 | La | Cl, Br | One or more elements selected from Ca, Ga, Co |
| Combination 15 | La | Cl, Br | One or more elements selected from Mn, Ti, Bi |
| Combination 16 | Ce | Cl, Br | One or more elements selected from Na, Fe, Ni |
| Combination 17 | Ce | Cl, Br | One or more elements selected from Ca, Ga, Co |
| Combination 18 | Ce | Cl, Br | One or more elements selected from Mn, Ti, Bi |

What is claimed is:

1. A scintillator crystal represented by the following general formula (1):

$$Ln_{(1-y)}Ce_yX_3:M \qquad (1)$$

wherein $Ln_{(1-y)}Ce_yX_3$ represents the chemical composition of the matrix material, Ln represents one or more elements selected from the group consisting of rare earth elements, X represents one or more elements selected from the group consisting of halogen elements, M is the constituent element of the dopant which is doped in the matrix material and represents one or more elements selected from the group consisting of Li, Na, K, Rb, Cs, Al, Zn, Ga, Be, Mg, Ca, Sr, Ba, Sc, Ge, Ti, V, Cu, Nb, Cr, Mn, Fe, Co, Ni, Mo, Ru, Rh, Pb, Ag, Cd, In, Sn, Sb, Ta, W, Re, Os, Ir, Pt, Au, Hg, and Tl, and y represents a numerical value satisfying the condition represented by the following inequality (A):

$$0.0001 \leq y \leq 1 \qquad (A).$$

2. The scintillator crystal according to claim 1, wherein Ln is La.

3. The scintillator crystal according to claim 1, wherein X is Br.

4. The scintillator crystal according to claim 1, wherein M is present at 0.0001-0.05% by weight with respect to the total weight of the scintillator crystal.

5. The scintillator crystal according to claim 1, wherein the fluorescence intensity distribution for the wavelength of the emitted fluorescence has two maximum values, and of these maximum values, the value of the fluorescence intensity for the maximum value at the short wavelength end divided by the fluorescence intensity for the maximum value at the long wavelength end is greater than 0.7.

6. The scintillator crystal according to claim 1, which is a single crystal.

7. A radiation detector comprising a photomultiplier tube and a scintillator provided with a scintillator crystal according to claim 1 formed on the outer photoelectric surface of the photomultiplier tube.

8. The radiation detector according to claim 7, which is incorporated in a positron emission tomography apparatus.

9. The scintillator crystal according to claim 1, wherein M represents one or more elements selected from the group consisting of Na, Al, Zn, Ga, Be, Mg, Ca, Sr, Ba, Sc, Ge, Ti, V, Cu, Cr, Mn, Fe, Co, Ni, Rh, Pb, Ag, Cd, In, Sn, Sb, Pt, Au and Hg.

10. The scintillator crystal according to claim 1, wherein M represents one or more elements selected from the group consisting of Na, Al, Zn, Mg, Ca, Sr, Ba, V, Cu, Cr, Fe, Co, Ni, Pb and Pt.

11. The scintillator crystal according to claim 1, wherein X represents Cl.

12. The scintillator crystal according to claim 1, wherein X represents Br and Cl.

13. The scintillator crystal according to claim 1, wherein y is 0.001-0.1.

14. The scintillator crystal according to claim 1, wherein y is 0.005-0.05.

15. The scintillator crystal according to claim 1, wherein M represents one or more elements selected from the group consisting of Na, Fe and Ni.

16. The scintillator crystal according to claim 1, wherein M represents one or more elements selected from the group consisting of Ca, Ga, Co.

17. The scintillator crystal according to claim 1, wherein M represents one or more elements selected from the group consisting of Mn and Ti.

* * * * *